United States Patent
Wang et al.

(10) Patent No.: US 11,417,522 B2
(45) Date of Patent: Aug. 16, 2022

(54) TWO-DIMENSIONAL AlN MATERIAL AND ITS PREPARATION METHOD AND APPLICATION

(71) Applicant: South China University of Technology, Guangzhou (CN)

(72) Inventors: Wenliang Wang, Guangzhou (CN); Guoqiang Li, Guangzhou (CN); Yulin Zheng, Guangzhou (CN)

(73) Assignee: South China University of Technology, Guangzhou (CN)

( * ) Notice: Subject to any disclaimer, the term of this patent is extended or adjusted under 35 U.S.C. 154(b) by 218 days.

(21) Appl. No.: 16/980,059

(22) PCT Filed: Apr. 26, 2018

(86) PCT No.: PCT/CN2018/084543
§ 371 (c)(1),
(2) Date: Sep. 11, 2020

(87) PCT Pub. No.: WO2019/178916
PCT Pub. Date: Sep. 26, 2019

(65) Prior Publication Data
US 2021/0020428 A1      Jan. 21, 2021

(30) Foreign Application Priority Data
Mar. 21, 2018 (CN) .......................... 201810233105.X

(51) Int. Cl.
*H01L 21/02* (2006.01)
*H01L 31/18* (2006.01)
(Continued)

(52) U.S. Cl.
CPC ...... *H01L 21/0254* (2013.01); *C23C 16/0227* (2013.01); *C23C 16/303* (2013.01);
(Continued)

(58) Field of Classification Search
CPC .......... H01L 21/0254; H01L 21/02052; H01L 21/02433; H01L 21/02444;
(Continued)

(56) References Cited

U.S. PATENT DOCUMENTS

| 2011/0037052 A1 | 2/2011 | Schmidt et al. |
| 2014/0255705 A1 | 9/2014 | Nepal et al. |

(Continued)

FOREIGN PATENT DOCUMENTS

| CN | 101343733 A | 1/2009 |
| CN | 103779193 A | 5/2014 |

(Continued)

OTHER PUBLICATIONS

IOP Science, "Graphene-assisted growth of high-quality AlN by metalorganic chemical vapor deposition", Sep. 9, 2016.
(Continued)

*Primary Examiner* — David Vu
*Assistant Examiner* — Brandon C Fox
(74) *Attorney, Agent, or Firm* — The Dobrusin Law Firm, PC

(57) ABSTRACT

The present invention discloses a two-dimensional AlN material and its preparation method and application, wherein the preparation method comprises the following steps: (1) selecting a substrate and its crystal orientation; (2) cleaning the surface of the substrate; (3) transferring a graphene layer to the substrate layer; (4) annealing the substrate; (5) using the MOCVD process to introduce $H_2$ to open the graphene layer and passivate the surface of the substrate; and (6) using the MOCVD process to grow a two-dimensional AlN layer. The preparation method of the present invention has the advantages that the process is simple, time saving and efficient. Besides, the two-dimensional AlN material prepared by the present invention can be widely used in HEMT (Continued)

devices, deep ultraviolet detectors or deep ultraviolet LEDs, and other fields.

12 Claims, 2 Drawing Sheets

(51) Int. Cl.
    *H01L 29/778*      (2006.01)
    *C23C 16/02*      (2006.01)
    *C23C 16/30*      (2006.01)
    *C30B 25/18*      (2006.01)
    *C30B 29/40*      (2006.01)

(52) U.S. Cl.
    CPC .......... *C30B 25/186* (2013.01); *C30B 29/403* (2013.01); *H01L 21/02052* (2013.01); *H01L 21/0262* (2013.01); *H01L 21/02433* (2013.01); *H01L 21/02444* (2013.01); *H01L 21/02609* (2013.01); *H01L 21/0242* (2013.01); *H01L 21/02381* (2013.01)

(58) Field of Classification Search
    CPC ........... H01L 21/02609; H01L 21/0262; H01L 21/02381; H01L 21/0242; H01L 29/1606; C23C 16/0227; C23C 16/303; C30B 25/186; C30B 29/403

USPC .......................................................... 257/76
See application file for complete search history.

(56) References Cited

U.S. PATENT DOCUMENTS

| | | | | |
|---|---|---|---|---|
| 2015/0349064 | A1* | 12/2015 | Azize | ...................... H01L 33/12 438/478 |
| 2016/0137507 | A1 | 5/2016 | You et al. | |
| 2017/0250308 | A1* | 8/2017 | Jo | .......................... C30B 29/403 |

FOREIGN PATENT DOCUMENTS

| | | |
|---|---|---|
| CN | 105731825 A | 7/2016 |
| CN | 105734530 A | 7/2016 |
| CN | 105914139 A | 8/2016 |
| CN | 106835268 A | 6/2017 |

OTHER PUBLICATIONS

Materials Letters 160 (2015) 496-499, "Significant reduction of AlN wafer bowing grown on sapphire substrate with patterned graphene oxide", Joo Jin, et al.

Letters, published Online Aug. 29, 2016, "Two-dimensional gallium nitride realized via graphene encapsulation", Zakaria Y. Al Balushi.

* cited by examiner

TWO-DIMENSIONAL AlN MATERIAL AND ITS PREPARATION METHOD AND APPLICATION

FIELD OF THE INVENTION

The present invention relates to an AlN material, in particular to a two-dimensional AlN material and its preparation method and application.

BACKGROUND OF THE INVENTION

Geim and Novoselov successfully prepared graphene by mechanical exfoliation in 2004, and won the Nobel Prize in Physics in 2010. Since then, the research on graphene has become a hot issue in various fields of physics, chemistry and materials science. Due to the novel properties and huge application prospects of the two-dimensional layered material of graphene, other two-dimensional materials have also gradually become the research objects of researchers. Compared with bulk materials, two-dimensional layered materials generally have unique mechanical, thermal, optical, electrical and magnetic properties.

The bulk AlN material is a direct band gap semiconductor with a band gap width of 6.2 eV. It has the advantages of stable physical and chemical properties, high thermal conductivity and high electron saturation velocity, and is an ideal material for optoelectronic devices such as ultraviolet light emitting diodes and ultraviolet detector tubes. In recent years, AlN materials have received extensive attention due to their excellent properties. Among them, AlN nanomaterials are particularly prominent, e.g., AlN nanowires (one-dimensional semiconductors) have been successfully prepared in experiments and widely used in nanoscale electronic and optoelectronic devices due to their wide band gap and hexagonal geometry. Although 3D/1D AlN materials have been extensively studied, there is still a lack of research on 2D AlN materials and their preparation. When the AlN of the wurtzite structure is only a few atomic layers thick, a 2D graphene structure will be formed.

Due to the quantum confinement effect, the band gap of the two-dimensional AlN material will increase as the thickness of the same decreases. Thus, the two-dimensional AlN material can be widely used in high electron mobility transistor (HEMT) devices, deep ultraviolet detectors or deep ultraviolet LEDs, and other fields. Therefore, there is an urgent need for an effective method to prepare a two-dimensional AlN material with the graphene structure.

CONTENTS OF THE INVENTION

In order to overcome the above shortcomings and deficiencies of the prior art, the object of the present invention is to provide a two-dimensional AlN material and its preparation method and application. The present invention adopts the van der Waals epitaxy method to successfully prepare a two-dimensional AlN material of 1-3 atomic layers between the graphene and the substrate layer.

The object of the present invention is achieved by the following technical solution:

A method for preparing a two-dimensional AlN material, which is composed of a graphene layer bonded to a substrate layer by a van der Waals force, a two-dimensional AlN structure grown between the substrate layer and the graphene layer, and an AlN layer grown on the graphene layer, is provided, comprising the following specific steps:

(1) selecting a substrate and its crystal orientation;
(2) cleaning the surface of the substrate;
(3) transferring a graphene layer to the substrate layer to achieve van der Waals bonding;
(4) annealing the substrate: putting the substrate obtained in step (3) into an annealing chamber, and annealing the substrate at 950° C. to 1050° C. to obtain an atomically flat surface of the substrate;
(5) transferring the substrate/graphene obtained in step (4) to an MOCVD growth chamber, and introducing $H_2$ to open the graphene layer and passivate the surface of the substrate; wherein the specific process parameters are as follows: the substrate is heated to reach a temperature of 900° C. to 1000° C., the flow rate of $H_2$ is maintained at 80-100 sccm, and the time for $H_2$ introduction is 5-10 min; and
(6) using the MOCVD process to grow a two-dimensional AlN layer; specifically, TMAl (trimethyl aluminum) and $NH_3$ are introduced at a substrate temperature of 900° C. to 1000° C. to act on the surface of the substrate, so that Al and N atoms enter between the graphene layer and the substrate layer and react to form AlN; wherein the flow rates of TMAl and $NH_3$ are kept at 200-300 sccm and 10-30 sccm, respectively, and the time for the introduction of TMAl and $NH_3$ is 40-60 s, so as to obtain the two-dimensional AlN material.

Preferably, the substrate is an Si substrate, a sapphire substrate or an $MgAl_2O_4$ oxide substrate.

Preferably, the selecting the crystal orientation in step (1) is specifically as follows: if the substrate is an Si substrate, an epitaxial plane is selected that is 0.2° to 1° away from the (111) plane toward the (110) plane, wherein the orientation relationship of the crystal epitaxy is that the (0002) plane of AlN is parallel to the (111) plane of Si.

Preferably, the cleaning the surface of the substrate in step (2) is specifically as follows: putting the substrate in water and ultrasonically cleaning it at room temperature for 5-10 min to remove particles adhering to the surface of the substrate, then washing with ethanol to remove organic matters on the surface, and then blowing the cleaned substrate dry with high-purity dry nitrogen.

Preferably, the transferring a graphene layer to the substrate layer in step (3) is specifically as follows: the graphene layer is released into water, and air bubbles are removed from the surface of the graphene by a defoaming film, and then the defoamed graphene film layer is transferred to a target substrate.

Preferably, the annealing the substrate in step (4) takes 0.5-1 h.

The two-dimensional AlN material is prepared by the preparation method described above.

Preferably, the two-dimensional AlN material is composed of a substrate layer (1), a two-dimensional AlN structure layer (2), a graphene layer (3) and an AlN layer (4) from bottom to top; the two-dimensional AlN structure layer (2) is grown between the substrate layer (1) and the graphene layer (3), and the AlN layer (4) is grown on the graphene layer (3).

Preferably, the thickness of the substrate layer is 420-550 μm;

preferably, the thickness of the two-dimensional AlN structure layer is 2-5 nm;

preferably, the thickness of the graphene layer is 2-5 nm; and preferably, the thickness of the AlN layer is 300-400 nm.

The two-dimensional AlN material described above is used in the preparation of HEMT devices, deep ultraviolet detectors or deep ultraviolet LEDs.

Compared with the prior art, the present invention has the following advantages and benefits:

(1) The present invention adopts the van der Waals epitaxy method to successfully prepare a two-dimensional AlN material of 1-3 atomic layers between the graphene and the substrate layer, and the obtained two-dimensional AlN material can be widely used in HEMT devices, deep ultraviolet detectors or deep ultraviolet LEDs, and other fields.

(2) The present invention carries out the transfer process of the graphene layer on the substrate layer, which shortens the time taken for directly growing the graphene layer and has low cost.

(3) The preparation method proposed by the present invention is simple, time-saving and efficient.

DETAILED DESCRIPTION OF THE EMBODIMENTS

The present invention will be further described below in detail with reference to examples, but the embodiments of the present invention are not limited thereto.

Example 1

A preparation method of the two-dimensional AlN material grown on an Si substrate was used, comprising the following steps:

(1) selecting a substrate and its crystal orientation: an Si substrate was used, wherein an epitaxial plane was selected that was 0.2° away from the (111) plane toward the (110) plane, and wherein the orientation relationship of the crystal epitaxy was that the (0002) plane of AlN was parallel to the (111) plane of Si;

(2) cleaning the surface of the substrate: specifically, putting the Si substrate in deionized water and ultrasonically cleaning it at room temperature for 5 min to remove particles adhering to the surface of the Si substrate, then washing with ethanol to remove organic matters on the surface, and then blowing the cleaned Si substrate dry with high-purity dry nitrogen;

(3) transferring a graphene layer to the substrate layer to achieve van der Waals bonding: specifically, the graphene layer was released into deionized water, and air bubbles were removed from the surface of the graphene by a defoaming film, and then the defoamed graphene film layer was transferred to the Si substrate;

(4) annealing the substrate: putting the substrate obtained in step (3) into an annealing chamber, and annealing the Si substrate for 0.5 h at 950° C. to obtain an atomically flat surface of the Si substrate;

(5) transferring the Si substrate/graphene obtained in step (4) to an MOCVD growth chamber, and then introducing $H_2$ to open the graphene layer and passivate the surface of the Si substrate, wherein the specific process parameters were as follows: the substrate was heated to reach a temperature of 900° C., the flow rate of $H_2$ was maintained at 80 sccm, and the time for $H_2$ introduction was 5 min; and (6) using the MOCVD process to grow a two-dimensional AlN layer: specifically, after the introduction of $H_2$, TMAl and $NH_3$ were introduced at a substrate temperature of 900° C. to act on the surface of the substrate, so that Al and N atoms entered between the graphene layer and the substrate layer and reacted to form AlN; wherein the flow rates of TMAl and $NH_3$ were kept at 200 sccm and 10 sccm, respectively, and the time for the introduction of TMAl and $NH_3$ was 40 s, so as to obtain the two-dimensional AlN material.

Figure 1:
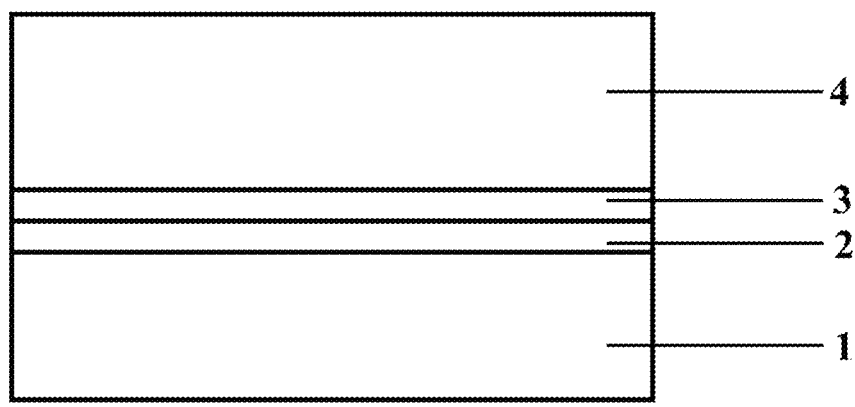
FIG. 1 is a schematic cross-sectional view of the two-dimensional AlN prepared in Example 1.

As shown in FIG. 1, the two-dimensional AlN material grown on the Si substrate prepared in this example comprised an Si substrate 1, a graphene layer 3 bonded to the Si substrate layer by a van der Waals force, a two-dimensional AlN structure 2 grown between the Si substrate layer and the graphene layer, and an AlN layer 4 grown on the graphene layer. The thicknesses of the Si substrate layer, the two-dimensional AlN structure layer, the graphene layer and the AlN layer were 420 μm, 2 nm, 4 nm and 300 nm, respectively.

Figure 2:
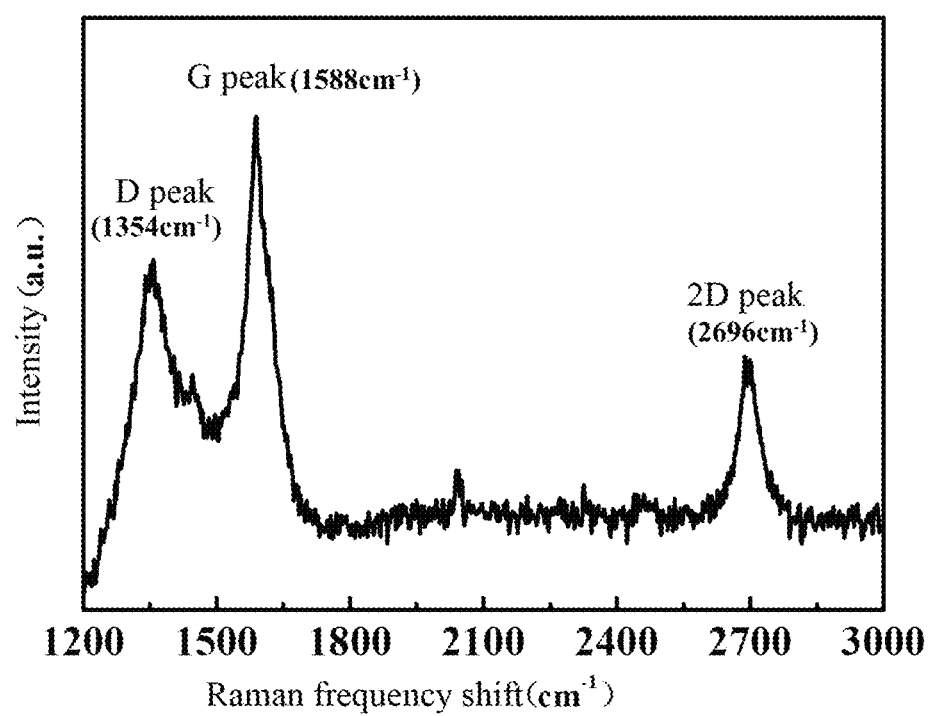
FIG. 2 shows a Raman spectrum of the two-dimensional AlN prepared in Example 1.

FIG. 2 shows a Raman spectrum of the two-dimensional AlN prepared in this example. It can be seen from the figure that the peaks at 1354 $cm^{-1}$, 1588 $cm^{-1}$ and 2697 $cm^{-1}$ corresponded to the D peak (about 1350 $cm^{-1}$), G peak (about 1587 $cm^{-1}$) and 2D peak (2700 $cm^{-1}$) of graphene, respectively, confirming the presence of graphene.

Figure 3:
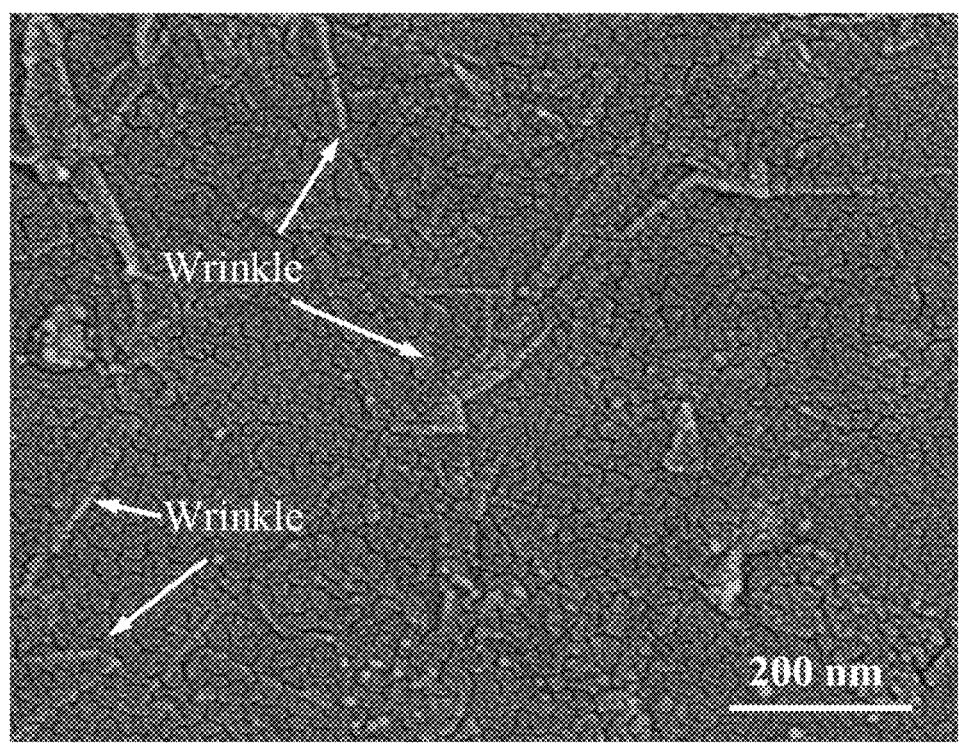
FIG. 3 shows a scanning electron microscope characterization image of the two-dimensional AlN prepared in Example 1.

FIG. 3 shows a scanning electron microscope characterization image of the two-dimensional AlN prepared in this example. It can be seen that the layered two-dimensional AlN was epitaxially grown on the Si substrate/graphene layer, and the wrinkle region on the surface might be caused by defects and inhomogeneity of the graphene.

Figure 4:
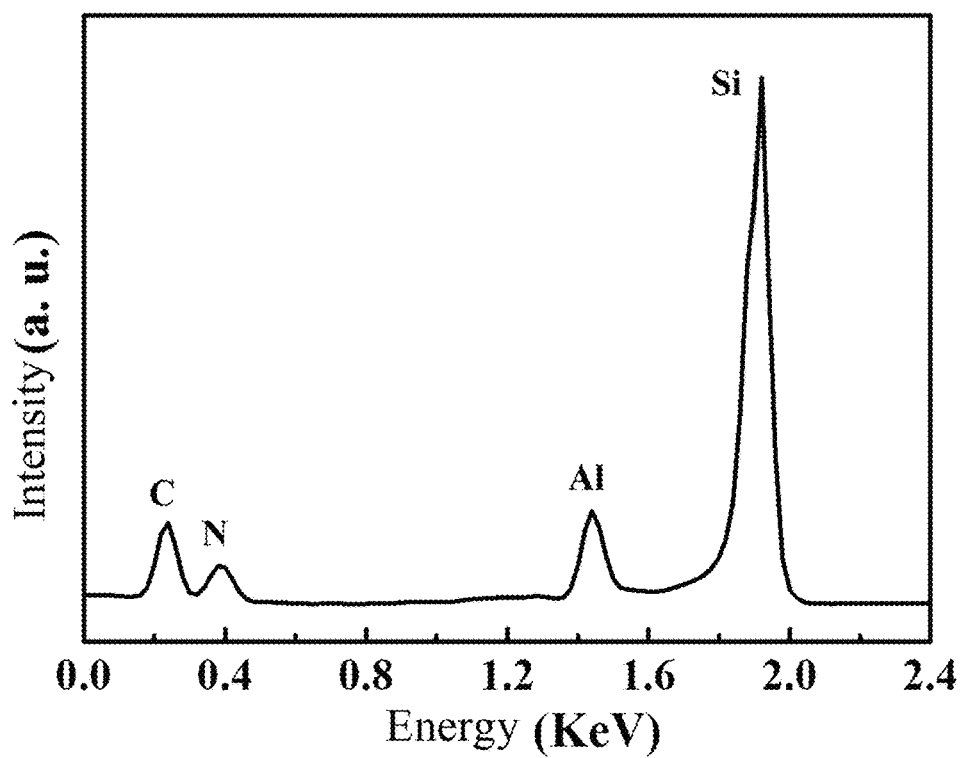
FIG. 4 shows an energy spectrum of the two-dimensional AlN prepared in Example 1.

FIG. 4 shows an energy spectrum of the two-dimensional AlN prepared in this example. It can be seen that there were C, N, Al and Si elements in the epitaxial film, which confirmed the existence of the two-dimensional AlN and graphene.

Example 2

A preparation method of the two-dimensional AlN material grown on a sapphire substrate was used, comprising the following steps:

(1) selecting a substrate and its crystal orientation: a c-plane sapphire was used as a substrate, wherein an epitaxial plane was selected that was 0.6° away from the (0001) plane toward the (1-100) plane, and wherein the orientation relationship of the crystal epitaxy was that the (0002) plane of AlN was parallel to the (0001) plane of sapphire;

(2) cleaning the surface of the substrate: specifically, putting the sapphire substrate in deionized water and ultrasonically cleaning it at room temperature for 8 min to remove particles adhering to the surface of the sapphire substrate, then washing with ethanol to remove organic matters on the surface, and then blowing the cleaned sapphire substrate dry with high-purity dry nitrogen;

(3) transferring a graphene layer to the substrate layer to achieve van der Waals bonding: specifically, the graphene layer was released into deionized water, and air bubbles were removed from the surface of the graphene by a defoaming film, and then the defoamed graphene film layer was transferred to the sapphire substrate;

(4) annealing the substrate: putting the sapphire substrate obtained in step (3) into an annealing chamber, and annealing the sapphire substrate for 1 h at 1000° C. to obtain an atomically flat surface of the sapphire substrate;

(5) transferring the sapphire substrate/graphene obtained in step (4) to an MOCVD growth chamber, and then introducing $H_2$ to open the graphene layer and passivate the surface of the sapphire substrate, wherein the specific process parameters were as follows: the substrate was heated to reach a temperature of 1000° C., the flow rate of $H_2$ was maintained at 100 sccm, and the time for $H_2$ introduction was 8 min; and (6) using the MOCVD process to grow a two-dimensional AlN layer: specifically, after the introduction of $H_2$, TMAl and $NH_3$ were introduced at a substrate temperature of 950° C. to act on the surface of the substrate, so that Al and N atoms entered between the graphene layer and the substrate layer and reacted to form AlN; wherein the flow rates of TMAl and $NH_3$ were kept at 300 sccm and 30 sccm, respectively, and the time for the introduction of TMAl and $NH_3$ was 60 s, so as to obtain the two-dimensional AlN material.

The two-dimensional AlN material grown on the c-plane sapphire substrate prepared in this example comprised a c-plane sapphire substrate, a graphene layer bonded to the c-plane sapphire substrate layer by a van der Waals force, a two-dimensional AlN structure grown between the c-plane sapphire substrate layer and the graphene layer, and an AlN layer grown on the graphene layer. The thicknesses of the c-plane sapphire substrate layer, the two-dimensional AlN structure layer, the graphene layer and the AlN layer were 480 μm, 5 nm, 2 nm and 400 nm, respectively.

The test data of the two-dimensional AlN material grown on the sapphire substrate prepared in this example were close to those in Example 1, and will not be repeated here.

Example 3

A preparation method of the two-dimensional AlN material grown on an $MgAl_2O_4$ substrate was used, comprising the following steps:

(1) selecting a substrate and its crystal orientation: an $MgAl_2O_4$ substrate was used, wherein an epitaxial plane was selected that was 1.0° away from the (111) plane toward the (110) plane, and wherein the orientation relationship of the crystal epitaxy was that the (0002) plane of AlN was parallel to the (111) plane of $MgAl_2O_4$;

(2) cleaning the surface of the substrate: specifically, putting the $MgAl_2O_4$ substrate in deionized water and ultrasonically cleaning it at room temperature for 10 min to remove particles adhering to the surface of the $MgAl_2O_4$ substrate, then washing with ethanol to remove organic matters on the surface, and then blowing the cleaned $MgAl_2O_4$ substrate dry with high-purity dry nitrogen;

(3) transferring a graphene layer to the substrate layer to achieve van der Waals bonding: specifically, the graphene layer was released into deionized water, and air bubbles were removed from the surface of the graphene by a defoaming film, and then the defoamed graphene film layer was transferred to the $MgAl_2O_4$ substrate;

(4) annealing the substrate: putting the $MgAl_2O_4$ substrate obtained in step (3) into an annealing chamber, and annealing the $MgAl_2O_4$ substrate for 0.8 h at 1050° C. to obtain an atomically flat surface of the $MgAl_2O_4$ substrate;

(5) transferring the $MgAl_2O_4$ substrate/graphene obtained in step (4) to an MOCVD growth chamber, and then introducing $H_2$ to open the graphene layer and passivate the surface of the $MgAl_2O_4$ substrate, wherein the specific process parameters were as follows: the substrate was heated to reach a temperature of 950° C. , the flow rate of $H_2$ was maintained at 90 sccm, and the time for $H_2$ introduction was 10 min; and (6) using the MOCVD process to grow a two-dimensional AlN layer: specifically, after the introduction of $H_2$, TMAl and $NH_3$ were introduced at a substrate temperature of 1000° C. to act on the surface of the substrate, so that Al and N atoms entered between the graphene layer and the substrate layer and reacted to form AlN; wherein the flow rates of TMAl and $NH_3$ were kept at 250 sccm and 25 sccm, respectively, and the time for the introduction of TMAl and $NH_3$ was 50 s, so as to obtain the two-dimensional AlN material.

The two-dimensional AlN material grown on the $MgAl_2O_4$ substrate prepared in this example comprised an $MgAl_2O_4$ substrate, a graphene layer bonded to the $MgAl_2O_4$ substrate layer by a van der Waals force, a two-dimensional AlN structure grown between the $MgAl_2O_4$ substrate layer and the graphene layer, and an AlN layer grown on the graphene layer. The thicknesses of the $MgAl_2O_4$ substrate layer, the two-dimensional AlN structure layer, the graphene layer and the AlN layer were 550 μm, 4 nm, 5 nm and 350 nm, respectively.

The test data of the two-dimensional AlN material grown on the $MgAl_2O_4$ substrate prepared in this example were close to those in Example 1, and will not be repeated here.

The above examples are preferred embodiments of the present invention, but the embodiments of the present invention are not limited thereto, and any other alterations, modifications, replacements, combinations and simplifications made without departing from the spirit and principle of the present invention should all be equivalent substitutions and included in the protection scope of the present invention.

The invention claimed is:

1. A preparation method of a two-dimensional AlN material, characterized in that the method comprises the following steps:
   (1) selecting a substrate and its crystal orientation;
   (2) cleaning the surface of the substrate;
   (3) transferring a graphene layer to the substrate layer to achieve van der Waals bonding;
   (4) annealing the substrate: putting the substrate obtained in step (3) into an annealing chamber, and annealing the substrate at 950° C. to 1050° C. to obtain an atomically flat surface of the substrate;
   (5) transferring the substrate/graphene obtained in step (4) to an MOCVD growth chamber, and introducing $H_2$ to open the graphene layer and passivate the surface of the substrate; wherein the specific process parameters are as follows: the substrate is heated to reach a temperature of 900° C. to 1000° C., the flow rate of $H_2$ is maintained at 80-100 sccm, and the time for $H_2$ introduction is 5-10 min; and
   (6) using the MOCVD process to grow a two-dimensional AlN layer; specifically, TMAl and $NH_3$ are introduced at a substrate temperature of 900° C. to 1000° C. to act on the surface of the substrate, so that Al and N atoms enter between the graphene layer and the substrate layer and react to form AlN; wherein the flow rates of TMAl and $NH_3$ are kept at 200-300 sccm and 10-30 sccm, respectively, and the time for the introduction of TMAl and $NH_3$ is 40-60 s, so as to obtain the two-dimensional AlN material.

2. The preparation method of the two-dimensional AlN material according to claim 1, characterized in that: the substrate is an Si substrate, a sapphire substrate or an $MgAl_2O_4$ oxide substrate.

3. The preparation method of the two-dimensional AlN material according to claim 1, characterized in that the selecting the crystal orientation in step (1) is specifically as follows: if the substrate is an Si substrate, an epitaxial plane is selected that is 0.2° to 1° away from the (111) plane toward the (110) plane, wherein the orientation relationship of the crystal epitaxy is that the (0002) plane of AlN is parallel to the (111) plane of Si.

4. The preparation method of the two-dimensional AlN material according to claim 1, characterized in that the cleaning the surface of the substrate in step (2) is specifically as follows: putting the substrate in water and ultrasonically cleaning it at room temperature for 5-10 min to remove particles adhering to the surface of the substrate, then washing with ethanol to remove organic matters on the surface, and then blowing the cleaned substrate dry with high-purity dry nitrogen.

5. The preparation method of the two-dimensional AlN material according to claim 1, characterized in that the transferring a graphene layer to the substrate layer in step (3) is specifically as follows: the graphene layer is released into water, and air bubbles are removed from the surface of the graphene by a defoaming film, and then the defoamed graphene film layer is transferred to a target substrate.

6. The preparation method of the two-dimensional AlN material according to claim 1, characterized in that: the annealing the substrate in step (4) takes 0.5-1 h.

7. A two-dimensional AlN material prepared by the preparation method according to claim 1.

8. A two-dimensional AlN material according to claim 7, characterized in that: the material is composed of a substrate layer (1), a two-dimensional AlN structure layer (2), a graphene layer (3) and an AlN layer (4) from bottom to top.

9. A two-dimensional AlN material according to claim 8, characterized in that:
the thickness of the substrate layer is 420-550 μm;
the thickness of the two-dimensional AlN structure layer is 2-5 nm;
the thickness of the graphene layer is 2-5 nm; and
the thickness of the AlN layer is 300-400 nm.

10. The two-dimensional AlN material according to claim 7, wherein the material is used for preparing HEMT devices, deep ultraviolet detectors or deep ultraviolet LEDs.

11. The two-dimensional AlN material according to claim 8, wherein the material is used for preparing HEMT devices, deep ultraviolet detectors or deep ultraviolet LEDs.

12. The two-dimensional AlN material according to claim 9, wherein the material is used for preparing HEMT devices, deep ultraviolet detectors or deep ultraviolet LEDs.

* * * * *